(12) United States Patent
Bergemont

(10) Patent No.: US 6,225,163 B1
(45) Date of Patent: May 1, 2001

(54) PROCESS FOR FORMING HIGH QUALITY GATE SILICON DIOXIDE LAYERS OF MULTIPLE THICKNESSES

(75) Inventor: Albert Bergemont, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/507,708

(22) Filed: Feb. 18, 2000

(51) Int. Cl.⁷ .............................. H01L 21/00; H01L 21/20
(52) U.S. Cl. ........................ 438/264; 438/763; 438/981
(58) Field of Search ................................... 438/981, 264, 438/763; 257/500, 501

(56) References Cited

U.S. PATENT DOCUMENTS

| | | | |
|---|---|---|---|
| 6,048,800 | * 4/2000 | Nagashima et al. | 438/761 |
| 6,110,842 | * 8/2000 | Okuno et al. | 438/776 |
| 6,124,171 | * 9/2000 | Arghavani et al. | 438/286 |
| 6,130,132 | * 10/2000 | Hsieh et al. | 438/264 |
| 6,147,008 | * 11/2000 | Chwa et al. | 438/762 |
| 6,150,220 | * 11/2000 | Huh et al. | 438/275 |
| 6,153,469 | * 11/2000 | Yun et al. | 438/267 |
| 6,157,058 | * 12/2000 | Ogura | 438/262 |

* cited by examiner

Primary Examiner—Vu A. Le
Assistant Examiner—Michael S. Lebentritt
(74) Attorney, Agent, or Firm—Pillsbury Winthrop LLP

(57) ABSTRACT

A process for forming high quality gate silicon dioxide layers of multiple thicknesses. The process includes steps of first providing a semiconductor substrate (e.g., a silicon wafer) with at least a first active area, a second active area and an electrical isolation region separating the first and second active area, followed by the formation of a first gate silicon dioxide layer of a predetermined thickness (typically less than 100 angstroms) on the first and second active areas. A first silicon layer (e.g., a polysilicon or amorphous silicon layer) is then deposited on the first gate silicon dioxide layer and the electrical isolation region. Next, the first silicon layer is patterned using, for example, photolithographic and etching techniques, to form a patterned first silicon layer and to expose a portion of the first gate silicon dioxide layer that was grown on the second active area. Next, the exposed portion of the first gate silicon dioxide layer is removed and a second gate silicon dioxide layer of another predetermined thickness is formed on the second active area. A second silicon layer (e.g., a polysilicon or amorphous silicon layer) is then deposited on the second gate silicon dioxide layer and overlying the patterned first silicon layer. Finally, the second silicon layer is patterned to form a patterned second silicon layer.

8 Claims, 6 Drawing Sheets

PROCESS FOR FORMING HIGH QUALITY GATE SILICON DIOXIDE LAYERS OF MULTIPLE THICKNESSES

BACKGROUND OF THE INVENTION

1. Field of the Invention

The present invention relates to semiconductor device manufacturing methods and, in particular, to methods for forming gate silicon dioxide layers of multiple thicknesses.

2. Description of the Related Art

Typical Metal-Oxide-Semiconductor (MOS) semiconductor devices employ a gate silicon dioxide ($SiO_2$) layer to separate a gate electrode from a semiconductor substrate. A variety of integrated circuits, including those with a mixture of analog MOS transistors and digital MOS transistors, require the formation of gate silicon dioxide layers of two different thicknesses.

A conventional method for forming gate silicon dioxide layers of two thicknesses is illustrated in FIGS. 1–6. The conventional method includes first supplying a semiconductor substrate 10 including electrical isolation region 12, a high voltage active area 14, and a low voltage active area 16, as shown in FIG. 1. An intermediate silicon dioxide layer 18 (e.g., 50 angstroms in thickness) is then grown on both the high and low voltage active areas. The resulting structure is illustrated in FIG. 2. Next, as depicted in FIG. 3, a patterned photoresist layer 20 is formed covering a portion of the electrical isolation region 12 and a portion of the intermediate silicon dioxide layer 18 on the high voltage active area 14, while leaving a portion of the intermediate silicon dioxide layer 18 on the low voltage active area 16 exposed. The exposed portion of the intermediate silicon dioxide layer 18 is subsequently removed from the low voltage active area 16 using the patterned photoresist layer 20 as an etch mask. In the circumstance where the exposed portion of the intermediate silicon dioxide layer 18 on the low voltage active area 16 is removed using an etching technique that also etches the electrical isolation region 12, a step 22 can be created in the electrical isolation regions 12, as illustrated in FIG. 4. Following removal of the patterned photoresist layer 20, a low voltage gate silicon dioxide layer 24 is grown on the low voltage active area 16 using a thermal oxidation technique. During the growth of low voltage gate silicon dioxide layer 24, the intermediate silicon dioxide layer 18 that overlies the high voltage active area 14 is increased in thickness, thereby creating a high voltage gate silicon dioxide layer 26 overlying the high voltage active area 14. Since the intermediate silicon dioxide layer 18 is being increased in thickness at the same time that the low voltage gate silicon dioxide layer 24 is being grown, the resulting high voltage gate silicon dioxide layer 26 is thicker than the low voltage gate silicon dioxide layer 24. The resultant structure is shown in FIG. 5. A polysilicon layer (not shown) is then deposited and patterned to form high voltage patterned gate polysilicon layer 28 and low voltage patterned gate polysilicon layer 30. The resultant structure is depicted in FIG. 6.

There are several drawbacks associated with this conventional method. First, the quality (e.g., breakdown voltage and reliability) of the high voltage gate silicon dioxide layer 26 can be degraded due to contamination from contact with patterned photoresist layer 20.

Second, since the high voltage gate silicon dioxide layer 26 has been formed using the process steps employed to grow both the intermediate silicon dioxide layer 18 and the low voltage gate silicon dioxide layer 24, it can possess undesirable electrical characteristics. For example, if nitrogen is incorporated into the low voltage gate silicon dioxide layer 24 by employing a nitric oxide (NO) or nitrous oxide ($N_2O$) ambient during its growth, the high voltage gate silicon dioxide layer 26 will also face some degree of nitrogen incorporation. If the high voltage gate silicon dioxide layer 26 is used as a portion of an analog transistor, nitrogen incorporation can produce poor analog electrical characteristics. For example, unbalanced (i.e., unmatched) threshold voltages ($V_T$) between multiple analog transistors may result due to increased levels of trapping in the high voltage gate silicon dioxide layer 26.

Third, thickness control of the high voltage gate silicon dioxide layer 26 can be difficult since it is formed using two growth steps: namely, the intermediate silicon dioxide layer growth step and the low voltage silicon dioxide layer growth step.

Fourth, the conventional methods cannot be easily extended to the formation of gate silicon dioxide layers of more than two thicknesses.

Still needed in the field, therefore, is a process for manufacturing high quality multiple thickness gate silicon dioxide layers. The process should (i) not include steps wherein a gate silicon dioxide layer is in direct contact with a photoresist layer; (ii) provide for thickness control by forming each of the gate silicon dioxide layers in one step; (iii) provide for high and low voltage gate silicon dioxide layers to be formed using independent growth steps; and (iv) be easily extendable to multiple gate silicon dioxide layers of more than two thicknesses.

SUMMARY OF THE INVENTION

The present invention provides a process for forming high quality gate silicon dioxide layers of multiple thicknesses. The process does not include steps where a gate silicon dioxide layer is in direct contact with a photoresist layer. The process according to the present invention provides for improved control of the thickness and electrical characteristics of the gate silicon dioxide layers by forming each of multiple gate silicon dioxide layers in single independent steps. Thus, in a case of dual thickness gate silicon dioxide layers, the formation of a first gate silicon dioxide layer and a second gate silicon dioxide layer is accomplished by two separate steps. Such a process can be easily extendable to multiple gate silicon dioxide layers of more than two thicknesses.

Processes according to the present invention include the steps of first providing a semiconductor substrate (e.g., a silicon wafer) with at least a first active area, a second active area and an electrical isolation region separating the first and second active areas, followed by the formation of a first gate silicon dioxide layer of a predetermined thickness on the first and second active areas. A first silicon layer (e.g., a polysilicon or amorphous silicon layer) is then deposited on the first gate silicon dioxide layer and the electrical isolation region. The first silicon layer is subsequently patterned to form a patterned first silicon layer, as well as to expose a portion of the first gate silicon dioxide layer that was formed on the second active area. Next, the exposed portion of the first gate silicon dioxide layer is removed. A second gate silicon dioxide layer of another predetermined thickness is then formed on the second active area. A second silicon layer (e.g., a polysilicon or amorphous silicon layer) is subsequently deposited on the second gate silicon dioxide layer and overlying the patterned first silicon layer. Finally, the second silicon layer is patterned to form a patterned second silicon layer.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

Figure 1:
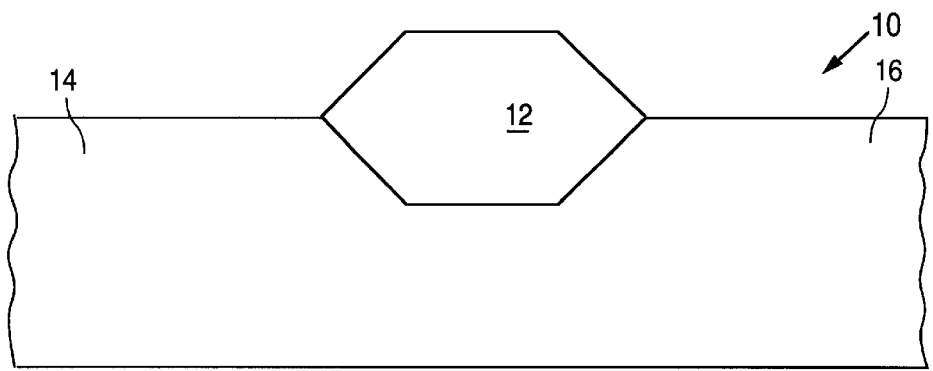
FIGS. 1–6 are cross-sectional views illustrating stages in a conventional process for forming gate silicon dioxide layers of two different thicknesses.
Figure 2:
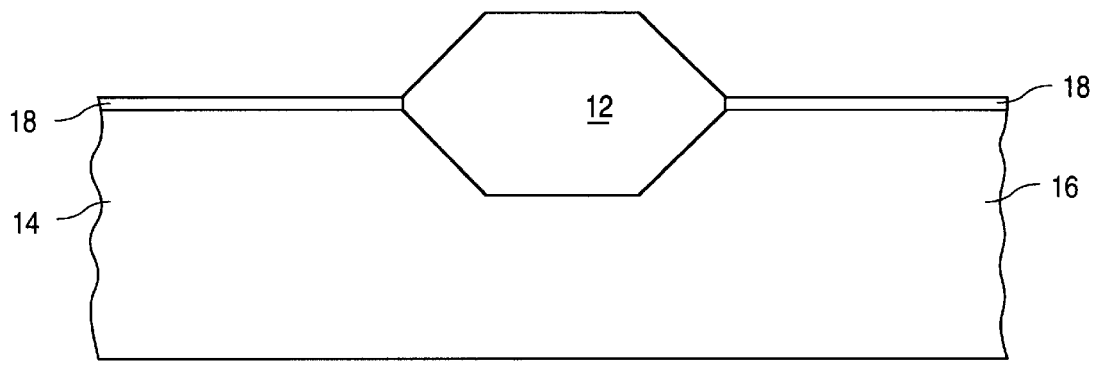
Figure 3:
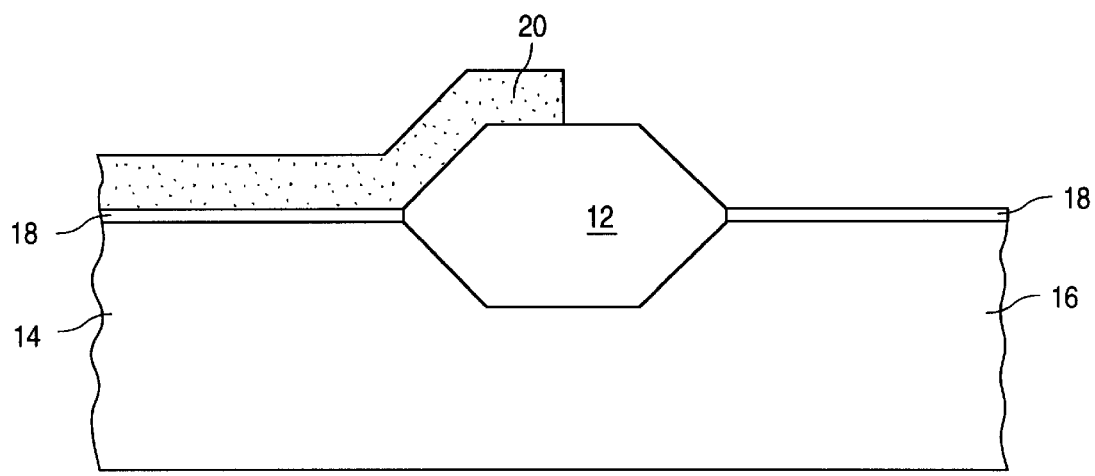
Figure 4:
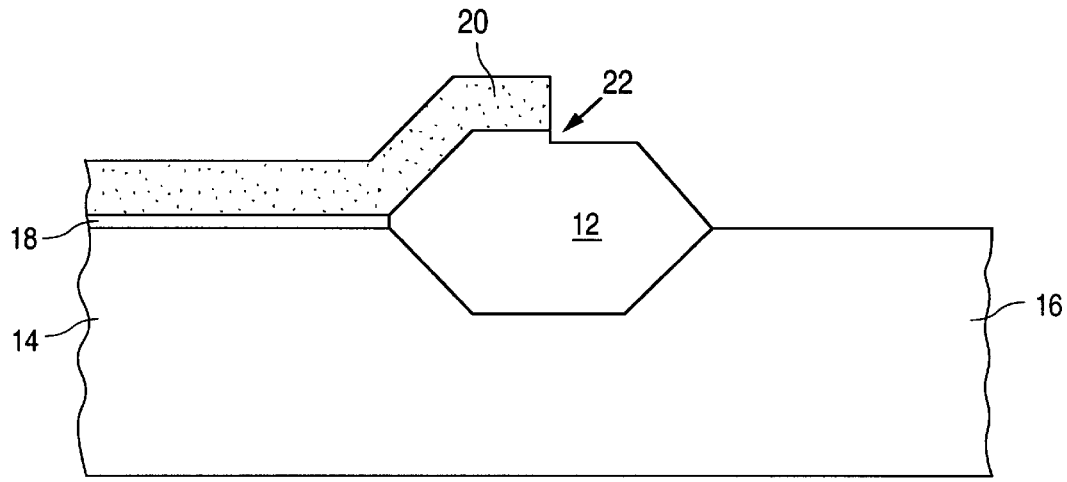
Figure 5:
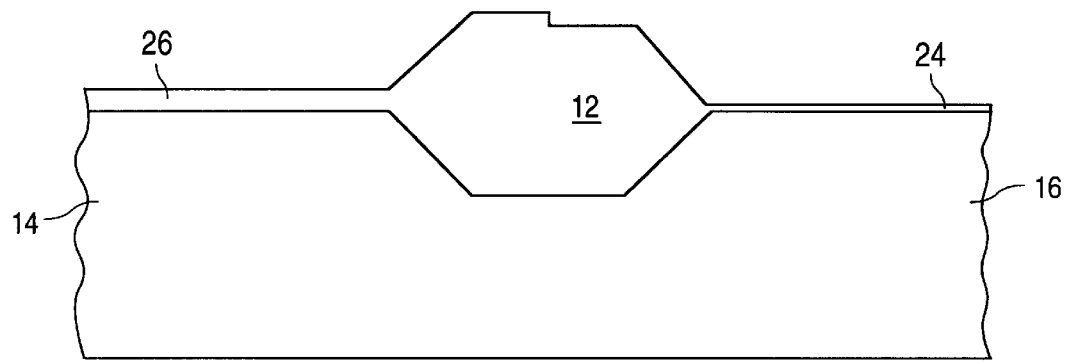
Figure 6:
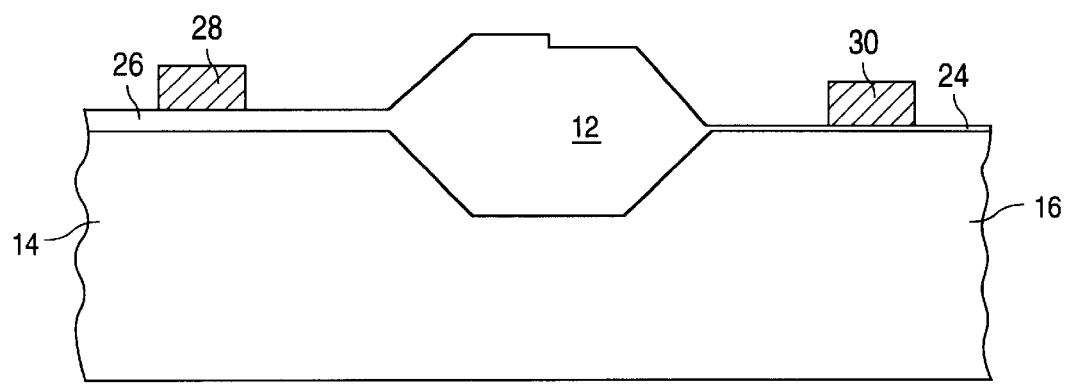
Figure 7:
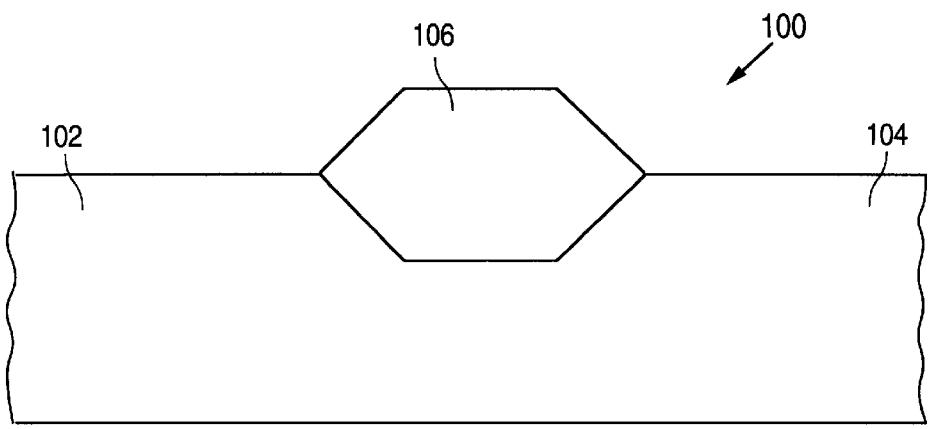
FIGS. 7–16 are cross-sectional views illustrating stages in a process in accordance with the present invention for forming gate silicon dioxide layers of two different thicknesses.

FIGS. 7–16 illustrate stages in a process according to the present invention. As shown in FIG. 7, a semiconductor substrate 100 is first provided. Semiconductor substrate 100 includes a first active area 102, a second active area 104 and an electrical isolation region 106 separating the first active area and the second active area.

The semiconductor substrate 100 can be any semiconductor substrate known to one skilled in the art including, for example, a silicon wafer, a silicon-on-insulator (SOI) substrate, or a silicon wafer with additional layers (e.g., an epitaxial layer) on its surface.

The first active area 102 and the second active area 104 are areas of the semiconductor substrate 100 where semiconductor devices (e.g., MOS analog and digital transistors) are to be formed. For example, the first active area 102 can be an active area where a high voltage and/or analog MOS transistor is to be formed, while the second active area 104 can be an area where a low voltage and/or digital MOS transistor will be formed. The electrical isolation region 106 can be, for example, a field oxidation (FOX) region formed using a thermal oxidation process or a shallow trench isolation (STI) region formed using well known conventional techniques. The electrical isolation region 106 is typically formed of $SiO_2$, although it can also be formed of other dielectric materials known in the art.

Figure 8:
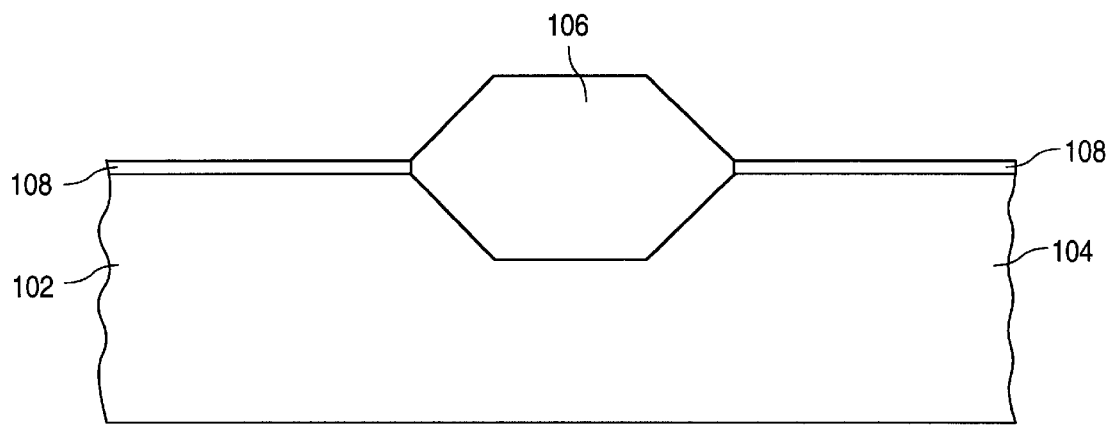

Next, a first gate silicon dioxide layer 108 (typically a thermally grown $SiO_2$ layer) of a predetermined thickness (typically less than 100 angstroms) is formed on the first active area 102 and the second active area 104, as illustrated in FIG. 8. The first gate silicon dioxide layer 108 can be formed using well known methods, such as a dry or wet thermal oxidation or a thermal oxidation employing an NO or $N_2O$ containing ambient. When the first gate silicon dioxide layer 108 is to be employed in a transistor operated at 3.3 volts, its predetermined thickness can be, for example, in the range of 63 angstroms to 77 angstroms. When, on the other hand, the first gate silicon dioxide layer 108 is to be used in a transistor operated at 2.5 volts, its predetermined thickness can be, for example, in the range of 45 angstroms to 55 angstroms. Furthermore, an exemplary predetermined thickness range, when first gate silicon dioxide layer 108 is to be used in a 1.8 volt transistor, is in the range of 30 angstroms to 40 angstroms.

Figure 9:
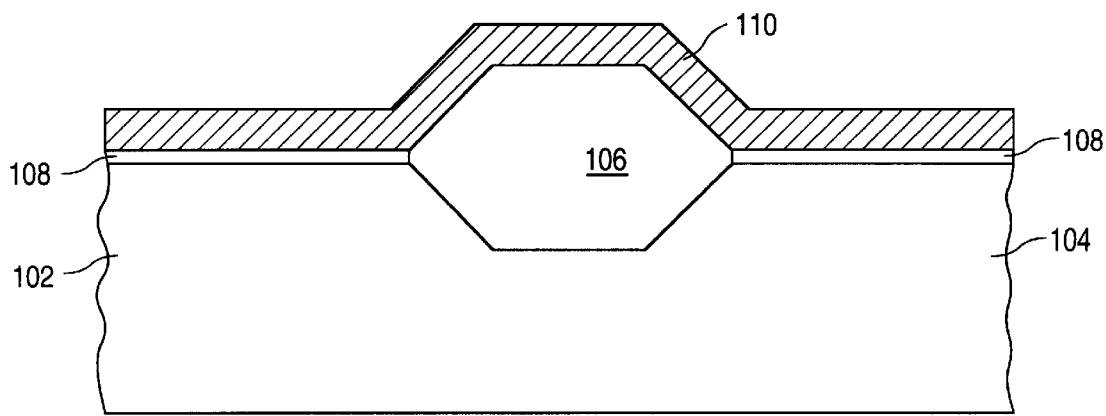

Next, a first silicon layer 110 is deposited on the first gate silicon dioxide layer 108 and the electrical isolation region 106. The first silicon layer 110 can be formed, for example, of polysilicon or amorphous silicon using standard techniques well known in the art, such as Low Pressure Chemical Vapor Deposition (LPCVD). For 1.8 volt to 3.3 volt technologies, the first silicon layer 110 has a typical thickness in the range of 1000 angstroms to 2000 angstroms. The resultant structure is shown in FIG. 9. The first silicon layer 110 is subsequently patterned to expose a portion of the electrical isolation region 106 and a portion of the first gate silicon dioxide layer 108 that was formed on the second active area 104, thereby creating a patterned first silicon layer 112.

Figure 10:
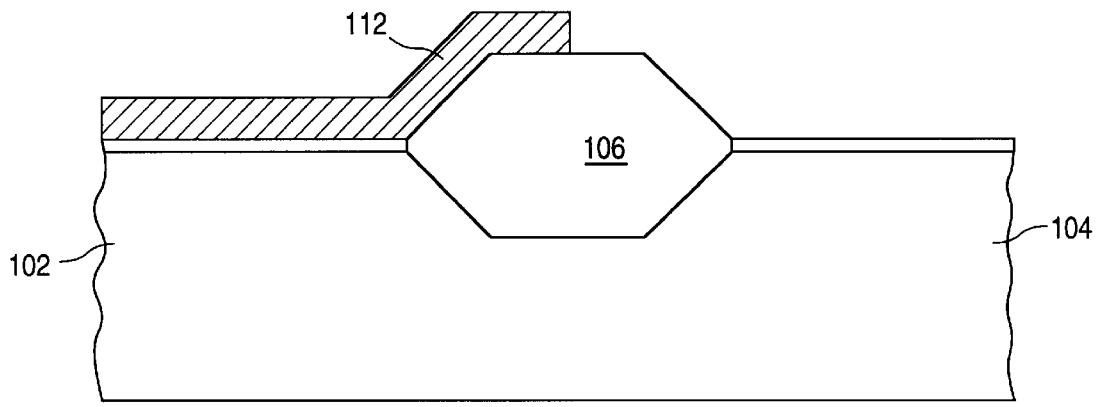

The first silicon layer 110 can be patterned using conventional photolithographic and etching techniques (e.g., wet chemical based or plasma etch techniques) that are well known in the art of semiconductor device manufacturing. It is preferred, but not required, that the first silicon layer 110 be patterned such that it terminates over the electrical isolation region 106, as depicted in FIG. 10. By terminating the first silicon layer 110 on the electrical isolation region 106 and then using a later step to form a first gate silicon layer (discussed below), there is a reduced risk of creating silicon stringers along the first gate silicon layer.

Figure 11:
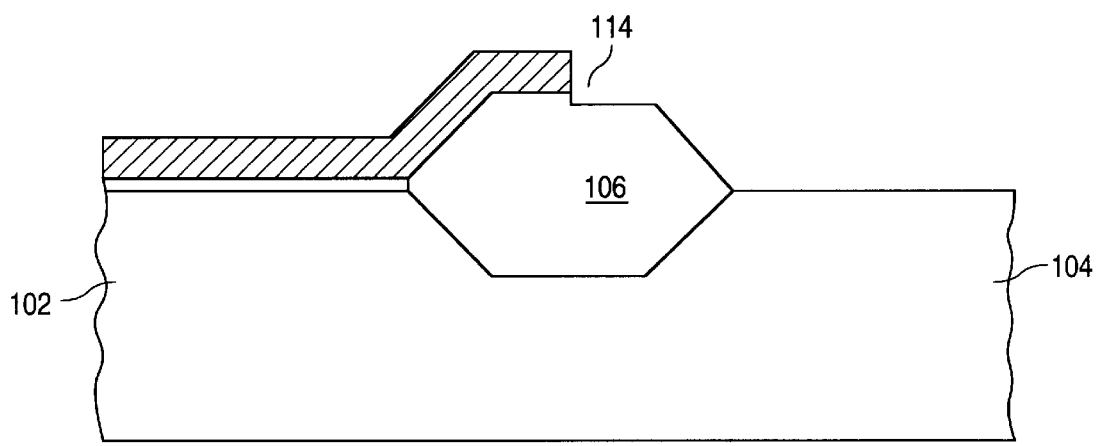
Figure 12:
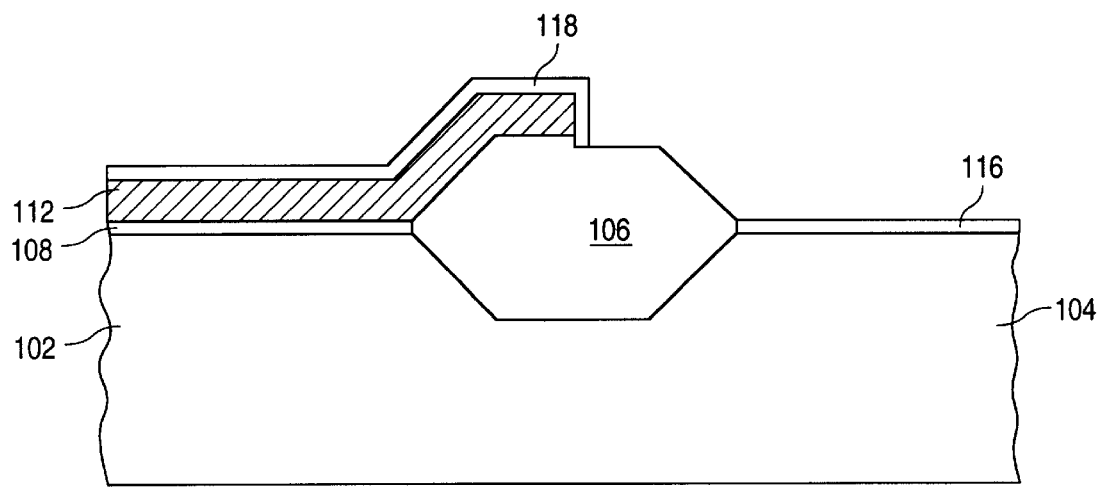

Next, the portion of the first gate silicon dioxide layer 108 that was formed on the second active area 104 is removed. This removal step can be accomplished using, for example, conventional wet etches, such as those employing an HF-based etchant. In the circumstance where an etching technique that also etches the electrical isolation region 106 is employed, a step 114 can be created in the electrical isolation regions 106, as illustrated in FIG. 11. A second gate silicon dioxide ($SiO_2$) layer 116 of another predetermined thickness is subsequently formed on the second active area 104, as illustrated in FIG. 12. Since the objective of processes according to the present invention is to form gate silicon dioxide layers of different thicknesses, this predetermined thickness of the second gate silicon dioxide layer 116 is different from the predetermined thickness of the first gate silicon dioxide layer 108. In the embodiment illustrated in FIGS. 7–16, the process used to form the second gate silicon dioxide layer 116 (e.g., a thermal oxidation process) also forms a silicon dioxide cap layer 118 over the patterned first silicon layer 112.

Figure 13:
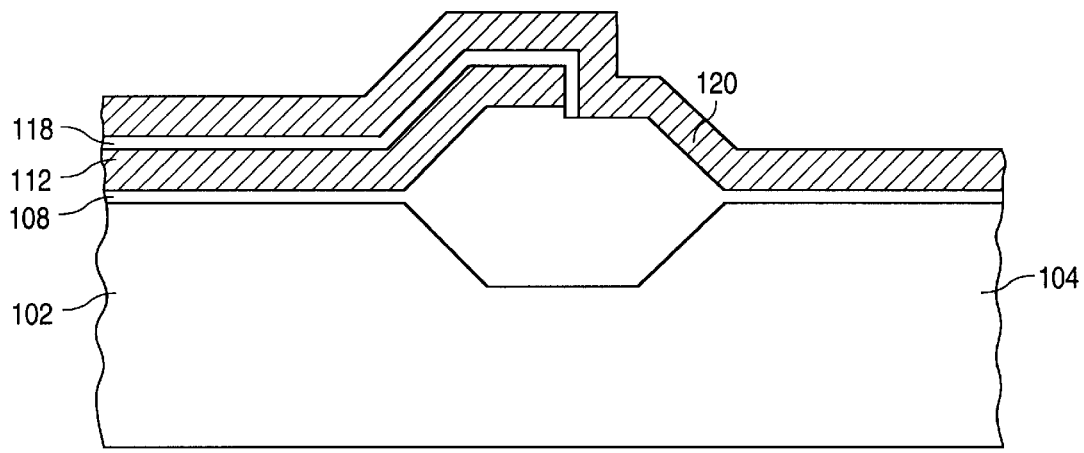
Figure 14:
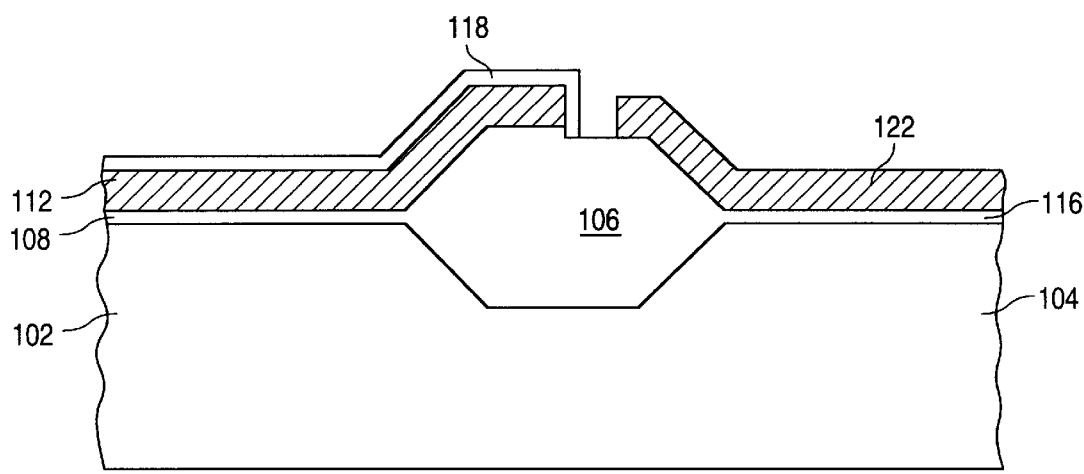
Figure 15:
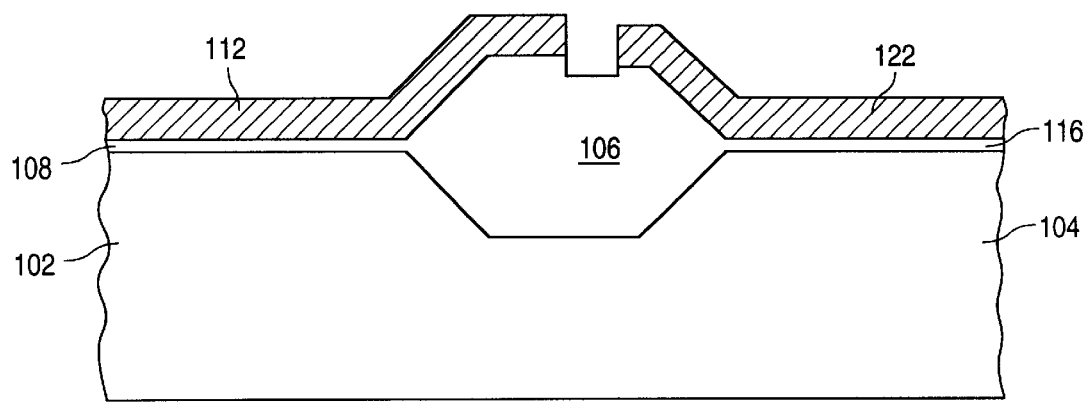

Next, a second silicon layer 120 is deposited on the second gate silicon dioxide layer 116, the electrical isolation region 106 and the silicon dioxide cap layer 118. The second silicon layer 120 can be formed, for example, of polysilicon or amorphous silicon using standard LPCVD techniques and has a thickness in the range of 1000 angstroms to 2000 angstroms. The resultant structure is shown in FIG. 13. The second silicon layer 120 is then patterned to form a patterned second silicon layer 122 covering at least a portion of the second gate silicon dioxide layer 116, as illustrated in FIG. 14. The patterning of the second silicon layer 120 can be accomplished using conventional photolithographic and etching techniques (e.g., wet chemical based or plasma etch techniques).

Figure 16:
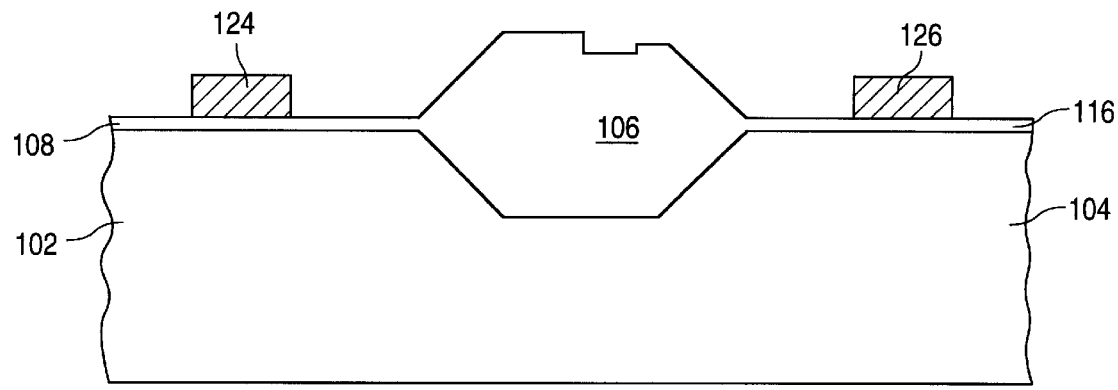

For a preferred embodiment where the patterned first silicon layer 112 is terminated on the electrical isolation area (as shown in FIG. 14), the patterning of the second silicon layer 120 is followed by (ii) the removal of the silicon dioxide cap layer 118 (see FIG. 15) and (ii) the patterning the patterned first silicon layer 112 and the patterned second silicon layer 122 to form a first gate silicon layer 124 and a second gate silicon layer 126, respectively (see FIG. 16). The removal of the silicon dioxide cap layer 118 can be accomplished using, for example, conventional wet chemical etching techniques. The patterning of the patterned first silicon layer 112 and the patterned second silicon layer 122 can be conducted using well known lithographic and etching techniques. Utilizing a patterning step to form the first gate silicon layer 124 and the second gate silicon layer 126 eliminates the possibility of forming silicon stringers from the second silicon layer 120 along the first gate silicon layer 124.

Processes according to the present invention provide several advantages over conventional processes. First, the first gate silicon dioxide layer 108 and the second gate silicon dioxide layer 116 are never in contact with a photoresist layer. By avoiding such a contact, there is a reduced risk of degrading the quality of the first and second gate silicon dioxide layers due to the introduction of photoresist constituents.

Second, since the first gate silicon dioxide layer 108 is formed independently of the second gate silicon dioxide layer 116, the process steps used to form each of these layers can be designed to provide these layers with desired electrical characteristics. For example, the first gate silicon dioxide layer 108 can be formed using a thermal process step that does not provide for the incorporation of nitrogen into that layer. While the second gate silicon dioxide layer 116 can be formed using a thermal process step that does provide for such incorporation. Furthermore, once apprised of this disclosure, it will be readily apparent to one skilled in the art that the first gate silicon dioxide layer 108 can be either thicker or thinner than the second gate silicon dioxide layer 116. It is preferred, however, that the first gate silicon dioxide layer 108 be thicker than the second gate silicon dioxide layer 116. In that case, the thermal process step used to form the thicker first gate silicon dioxide layer 108 will not affect the electrical and physical characteristics of the winner second gate silicon dioxide layer 116.

Third, thickness control of the first gate silicon dioxide layer 108 is improved since that layer is grown in one process step, rather than in the two steps used in conventional processing.

Finally, processes according to the present invention can be extended to form more than two gate silicon dioxide layers, each of a different thickness (i.e., more than the first and second gate silicon dioxide layers). Such an extension can be accomplished by removing an exposed portion of a gate silicon dioxide layer from an additional semiconductor substrate active area where it is desired to form an additional gate silicon dioxide layer of a different thickness (e.g., a third gate silicon dioxide layer); forming that additional gate silicon dioxide layer; depositing an additional silicon layer; and then patterning the additional silicon layer.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. A method for the formation of high quality gate silicon dioxide layers with multiple thicknesses, the method comprising the steps of:

providing a semiconductor substrate with at least a first active area and a second active area and an electrical isolation region separating the first active area and the second active area;

forming a first gate silicon dioxide layer of a predetermined thickness on the first active area and the second active area;

depositing a first silicon layer on the first gate silicon dioxide layer and the electrical isolation region;

patterning the first silicon layer to form a patterned first silicon layer and to expose a portion of the first gate silicon dioxide layer that was formed on the second active area;

removing the exposed portion of the first gate silicon dioxide layer;

forming a second gate silicon dioxide layer of another predetermined thickness on the second active area;

depositing a second silicon layer on the second gate silicon dioxide layer and overlying the patterned first silicon layer; and patterning the second silicon layer to form a patterned second silicon layer.

2. The method of claim 1 wherein the predetermined thickness of the second gate silicon dioxide layer is less than the predetermined thickness of the first silicon dioxide layer.

3. The method of claim 1 wherein the step of patterning the first silicon layer forms a patterned first silicon layer that terminates over the electrical isolation region and wherein the step of patterning the second silicon layer forms a patterned second silicon layer that terminates over the electrical isolation region.

4. The method of claim 3 wherein the step of forming a second gate silicon dioxide layer includes forming a silicon dioxide cap layer on the surface of the patterned first silicon layer and wherein the method further includes the steps of:

removing the silicon dioxide cap layer; and patterning the patterned first silicon layer and the patterned second silicon layer to form a first gate silicon layer and a second gate silicon layer, respectively.

5. The method of claim 1 wherein the steps of depositing a first silicon layer and depositing a second silicon layer include depositing polysilicon layers.

6. The method of claim 1 wherein the providing step includes providing a semiconductor substrate wherein the first active area is a high voltage active area and the second active area is a low voltage active area.

7. The method of claim 6 wherein the predetermined thickness of the first gate silicon dioxide layer is thicker than the predetermined thickness of the second gate silicon dioxide layer.

8. The method of claim 1 wherein the step of forming a first gate silicon dioxide layer forms an analog transistor gate silicon dioxide layer and the step of forming the second gate silicon dioxide layer forms a digital transistor gate silicon dioxide layer.

* * * * *